US006826500B2

(12) United States Patent
Linthicum et al.

(10) Patent No.: US 6,826,500 B2
(45) Date of Patent: Nov. 30, 2004

(54) METHOD AND SYSTEM FOR AUTOMATED MAINTENANCE AND TRAINING INSTRUCTION GENERATION AND VALIDATION

(75) Inventors: Steven Eric Linthicum, Niskayuna, NY (US); Russell Scott Blue, Clifton Park, NY (US); Christopher Richard Volpe, Niskayuna, NY (US); Craig Arthur Silber, Clifton Park, NY (US); Boris Yamrom, Schenectady, NY (US); Louis John Hoebel, Burnt Hills, NY (US); Tomek Strzalkowski, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 267 days.

(21) Appl. No.: 09/681,949

(22) Filed: Jun. 29, 2001

(65) Prior Publication Data

US 2003/0004908 A1 Jan. 2, 2003

(51) Int. Cl.$^7$ .............................................. G06F 19/00
(52) U.S. Cl. ........................................ 702/98; 345/702
(58) Field of Search ............................... 702/182–184, 702/188; 700/95–98; 345/418–420, 958, 964, 701, 702, 757

(56) References Cited

U.S. PATENT DOCUMENTS

| | | | | |
|---|---|---|---|---|
| 5,185,561 A | * | 2/1993 | Good et al. ................. | 318/432 |
| 5,590,268 A | * | 12/1996 | Doi et al. .................... | 345/848 |
| 5,619,630 A | | 4/1997 | Minami et al. ............. | 395/133 |
| 5,694,013 A | | 12/1997 | Stewart et al. .............. | 318/561 |
| 5,712,649 A | * | 1/1998 | Tosaki .......................... | 345/8 |
| 5,802,353 A | | 9/1998 | Avila et al. ................. | 395/500 |
| 5,905,501 A | | 5/1999 | Kato ........................... | 345/420 |
| 5,999,168 A | | 12/1999 | Rosenberg et al. ......... | 345/161 |
| 5,999,185 A | * | 12/1999 | Kato et al. .................. | 345/420 |
| 6,219,049 B1 | | 4/2001 | Zuffante et al. ............ | 345/339 |
| 2002/0123812 A1 | * | 9/2002 | Jayaram et al. .............. | 700/98 |

FOREIGN PATENT DOCUMENTS

| | | | |
|---|---|---|---|
| GB | 2327289 A | * | 1/1999 |
| WO | WO 00/38117 | * | 6/2000 |

OTHER PUBLICATIONS

Sensable Technologies, Boeing Add New Touch to Virtual Prototyping unattributed, SensAble Technologies, Aug. 10, 1999.*

Voxmap Pointshell (VPS) Software Library Press Release, unattributed, Boeing Co., 2003.*

Avila et al., Ricardo S. Avila, "A Haptic Interaction Method for Volume Visualization", 7$^{th}$ IEEE Visualization '96 Conference, Oct. 1996.*

Mahoney, "Giving Engineers the Magic Touch" Diana Phillips Mahoney Computer Graphics World, Aug. 1999.*

Dede, Testimony to the US Congress, House of Representatives, Joint Hearing on Educational Technology in the 21$^{st}$ Century, Oct. 12, 1995, pp 9–10.*

(List continued on next page.)

Primary Examiner—Marc S. Hoff
Assistant Examiner—Craig Steven Miller
(74) Attorney, Agent, or Firm—Jean K. Testa; Patrick K. Patnode (57) ABSTRACT

A system and computer implemented method for enabling field service of machines and training of field service personnel. The method comprises the steps of generating at least one validated sequence of instructions for at least one maintenance task and delivering the at least one validated sequence for use in performing the at least one maintenance task.

25 Claims, 5 Drawing Sheets

OTHER PUBLICATIONS

Connacher et al., Virtual Assembly Using Virtual Reality Techniques, Aug. 1997, pp7+.*

Jayaram et al., A Virtual Assembly Design Environment, 1999, pp 6+.*

Steffan et al., Integration of Virtual Teality Based Assembly Simulation into CAD/CAM Environments, 1998.*

Yuan et al., Mechanical Assembly With Data Glove Devices, 1997.*

Burns, Design of a Six Degree of Freedom Haptic Interface, Aug. 1996.*

Internet document www.crd.ge.com/~volpecr, BIO website for Christopher R. Volpe, GE Corporate Research & Development, unattributed, unattributed, May 2003.*

Internet document www.crd.ge.com/esl/cgsp/fact_sheet/indhap/index.html, Fact Sheet for Industrial Haptics, GE Corporate Research & Development, unattributed, unattributed, May 2003.*

Internet Document, Press Release for Industrial Haptics, Mar. 1998. GE Corporate Research & Development, unattributed.*

Patent application RD–27,075/USA, Ser. No. 09/606093, filed Jun. 27, 2000, "Method and System for Enabling Training of Field Service Personnel and Field Service of Machines", Rasikal P. Shah et al.

Patent application RD–27,549/USA, Ser. No. 09/617971, filed Oct. 5, 2000, "System and Method For Providing Interactive Haptic Collision Detection".

* cited by examiner

METHOD AND SYSTEM FOR AUTOMATED MAINTENANCE AND TRAINING INSTRUCTION GENERATION AND VALIDATION

FEDERAL RESEARCH STATEMENT

The US Government may have certain rights in this invention pursuant to contract number F33615-01-2-6000 awarded by the United States Air Force.

BACKGROUND OF INVENTION

The present invention relates generally to systems for generating and validating service manual instructions. More specifically, the invention relates to computer implemented methods and systems for enabling automated generation and validation of service manual instructions and for enabling delivery to field service personnel for the maintenance and service of products or machines in the field.

A major cost in the life cycle of technical information for a machine, product or piece of equipment is the creation of service and maintenance instructions from engineering data, as well as the additional costs associated with the validation and verification of the instructions.

Typically, the current process for developing documentation for a new product or machine includes developing assembly drawings for every step of the assembly process. From these drawings and other source data (photographs, engineering drawings, CIDs, etc.) an illustrated parts catalogue (IPC) is developed. For example, the IPC for a jet engine is a complete set of exploded views, starting at one end of the engine (fan) and taking off parts all the way down. The catalogue is then used to create new assembly and disassembly instructions. The shop manuals include information down to the piece part, while the maintenance manuals generally describe maintenance that can be done while the product is assembled and in service in the field. Typically, the art for the engine and maintenance manuals is taken directly from the IPC. On the average, both books have an illustration every fourth page.

The previous description is a best-case scenario. Usually there are time constraints for getting the new product or machine to the field, and the documentation must go along with it. Therefore, the assembly and disassembly are written without the IPC, resulting in a manual with omissions and mistakes. Often, multiple revisions are made, which can take a year or more typically, before the manual has the correct IPC numbers and sequence of instruction.

With any new product, there are typically design changes in the first year or two. This "real life beta test" generates a lot of manual changes as well. Generally, many resources are spent on revisions. Many service bulletins, usually in the form of written notices, are issued to make changes and improvements. Field service personnel are often required to perform service or maintenance using a variety of reference sources and as the field service personnel discover improved maintenance task sequences, there is generally no effective feedback process to improve the maintenance documentation. Additionally, training of field service personnel is similarly affected in that training often uses the same maintenance documentation and manual changes.

Additionally, training of field service personnel is generally performed by taking the equipment out of service for training purposes. In the cases of military and medical equipment, making the equipment available for training means the equipment is out of service for its intended use, since limited quantities of the military and medical equipment are generally present at a particular field site. Thus, training becomes inconvenient and costly.

There is a need for a computer-implemented method and system for generating and delivering maintenance and service instructions for use in field service maintenance and training of field service personnel. What is further needed is a method and system for verifying and validating the instructions, such as in a computer enabled or virtual environment.

SUMMARY OF INVENTION

The present invention provides, in a first aspect, a computer implemented method for enabling field service of machines and training of field service personnel. The method comprises the steps of generating at least one validated sequence of instructions for at least one maintenance task and delivering the at least one validated sequence for use in performing the at least one maintenance task.

In a second aspect, a system for enabling field service of machines and training of field service personnel is provided. The system comprises an engineering data generating device adapted to compute and provide engineering data relating to the machines, a service sequence generating device adapted to import and process the engineering data to generate at least one sequence of events for at least one maintenance task, an automated task order generating device adapted to convert the events into natural language instructions for use in the at least one maintenance task, a validating device adapted to verify the sequence of events and the natural language instructions and, a delivering device adapted to deliver the natural language instructions to the field service personnel.

BRIEF DESCRIPTION OF DRAWINGS

The features and advantages of the present invention will become apparent from the following detailed description of the invention when read with the accompanying drawings in which.

DETAILED DESCRIPTION

Figure 1:
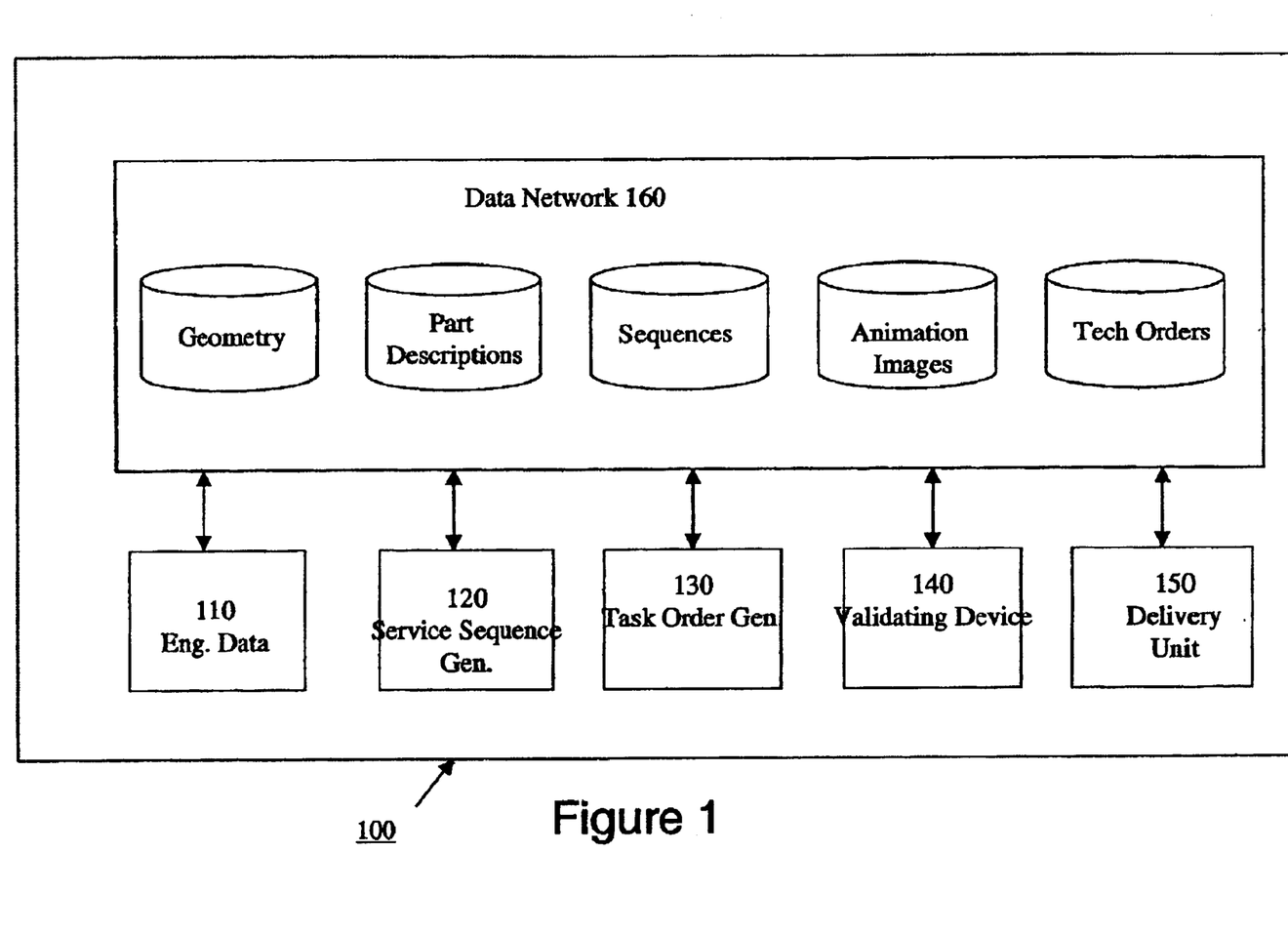
FIG. 1 is a block diagram illustrating a system for enabling field service of machines and training of field service personnel incorporating embodiments of the present invention.

FIG. 1 is a block diagram of one example of a computing environment or system 100 incorporating and using the capabilities and techniques of the present invention for enabling field service of machines and training of field service personnel. Generally, machines requiring field service are of a type that remain at the field site, and are desirably serviced at a field site since it is generally not possible or desirable to return the machine to the place of manufacture. Examples of such machines are air craft engines, weapon systems, other military equipment, medical imaging devices such as computed tomography (CT) machines, magnetic resonance imaging (MRI) machines, mammography machines, ultrasound machines, x-ray machines and other large field equipment such as power turbines, locomotives, and the like. Although the present invention is described in connection with military equipment and machines, the systems and methods of the present invention can be used and applied in connection with other electrical and mechanical machines, such as, for example, automotive engines, appliances, power and utility service equipment and office equipment.

Referring to FIG. 1, system 100 is desirably maintained by or on behalf of a machine manufacturer or service provider and usable by field service personnel at a field site such as, for example, a military base or a hospital or medical center during installation, maintenance or repair of a machine. In addition, system 100 is included as part of a service contract with a customer such as, for example, a hospital or medical center for maintenance of medical machines based on a yearly or per visit fee arrangement.

System 100 comprises engineering data generator 110, service sequence generator 120, automated task order generator 130, validation unit 140 and instruction delivery unit 150. System 100 further comprises a data network 160 for storing various data, computation results and intermediate information generated by the various components of system 100. Each of the components of system 100 form part of a local area network or global communications network such as the Internet which comprises a vast number of computers, servers and computer networks that are interconnected through communication links. Further connections desirably include portable computers, such as personal computers of field service personnel, computer networks of field sites, video and computer workstations, and hand held computers. The above-described computing environment and computing units are only offered as examples. The present invention is capable of being incorporated and used with many types of computing units, computers, processors, nodes, systems, workstations and/or environments without departing from the spirit of the present invention. Further, various aspects of the invention are equally applicable to computing units that are remote from one another, computing units sharing a local network, computing units running on the same physical machine, different machines or any combination thereof. For example, the present invention is implemented on a portable computer or laptop computer wherein the engineering data is stored on a compact disc, or alternatively the engineering data is imported from a remote location via the Internet.

Engineering data generator 110 is adapted to compute and provide various forms of engineering data that are well known in the art such as, for example, computer aided design (CAD) geometry such as three-dimensional (3D) models, specifications, and engineering drawings. The various engineering data are typically created during the machine design phase. As used herein "adapted to", "configured to" and the like refer to components having a structure (e.g. sensor) and a processing capability (e.g., with a programmable computer, Application Specific Integrated Circuit (ASIC), or the like) for performing a stated function. These terms also refer to mechanical or structural connections between elements to allow the elements to cooperate to provide a described effect. Further, these terms also refer to operation capabilities of electrical elements such as analog or digital computers or application specific devices (such as an application specific integrated circuit (ASIC)) that are programmed to perform a sequel to provide an output in response to given input signals.

Service sequence generator 120 is adapted to import and process the engineering data from engineering data generator 110 to create a disassembled view of the machine. The disassembled view is referred to as the exploded view in the art. Service sequence generator 120 is also adapted to generate a sequence of actions necessary for a particular maintenance task. Desirably, this sequence will be generated solely from the engineering data, for example the three-dimensional CAD geometry or other engineering data described above, for identifying the order of parts removal for efficient performance of the identified task. Known visualization systems exist which enable design engineers to view and manipulate large three-dimensional product assemblies. One such application is, for example, GE Product Vision, which enables engineers to create removal paths of assembly components by defining points in a three-dimensional environment, and an automated part path planner, which can find an interference-free removal path for a component. Other known design tools provide the engineers with the ability to view large data sets in a virtual environment. These tools generally use techniques to convert CAD solid models to tessellated representations, and further provide the ability to rapidly load large data sets and interactively navigate or "fly" around them to examine clearance and interference issues within a product assembly. An exemplary application is Galileo by General Electric (GE), which is typically used as a production visualization tool having an enhanced ability to view a large data set and also having the ability to create removal paths.

Service sequence generator 120 is adapted to automatically generate the service sequences for the parts of the assembly and an exploded view for communicating the assembly intent. The automatic generation of service sequences is enabled upon import of the engineering data from engineering data generator 110. The service sequences are computed by service sequence generator 120 based on the mating interfaces between components of a machine. Information from three-dimensional engineering data and component positions and orientation in space determine all mating surfaces between components. Mating surfaces between each pair of components is generated by analyzing mutual spatial relationships between each pair of polygons taken from each component. This approach requires polygonal representation of the geometry, obtainable as output from commercial CAD and visualization tool packages.

In a method of the present invention, it is desirable that substantially all possible sets of sequences for the explosion of the given assembly are considered. However, to consider all possible sets of sequences would be computationally extensive. Thus, service sequence generator 120 uses some heuristics to limit the set of sequences for the explosion. Heuristics, as used herein, refer to programmed rules and conditions for removal paths, and such conditions will be described with reference to FIG. 2. Use of heuristics limit the number of possible sequences from growing exponentially with the number of parts of the assembly, therefore avoiding extensive computations.

Figure 2:
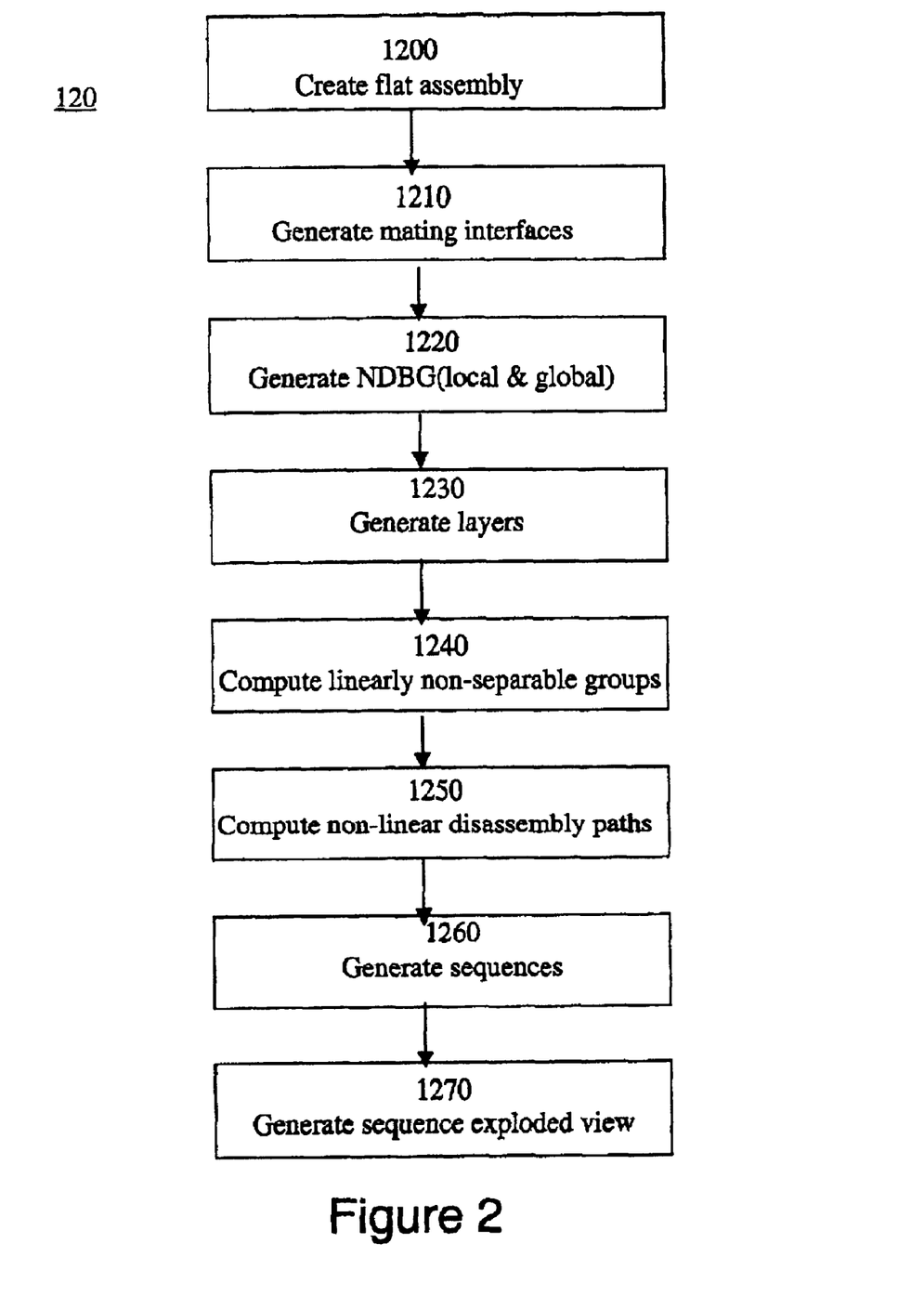
FIG. 2 is flow diagram illustrating a method for generating a service sequence for use in the system illustrated in FIG. 1.

FIG. 2 illustrates a process flow diagram for an embodiment of a method for generating service sequences by service sequence generator 120 (FIG. 1). The method comprises the steps of creating a flat assembly 1200, generating mating interfaces at 1210, generating local and global non-directional blocking graphs (NDBG) at 1220, generating layers at 1230, computing linearly non-separable groups of parts at 1240, computing non-linear paths for disassembling groups generated in 1240 at 1250, generating sequences at 1260, and generating sequence exploded views at 1270.

Each of the process steps will be discussed further below. As depicted in FIG. 1, every process step or subsystem stores the results of processing into and retrieves the necessary input data from data network 160.

Referring further to FIG. 2, at step 1200, a flat assembly is created. A flat assembly is a list of generally all parts in a given assembly. Each part has geometry, orientation and position information associated with it. Generally, subassembly structures are disregarded if they are presented in the CAD database. Typically, CAD tools provide subassembly information such as sub-groups of parts. However, considerations for removal paths and disassembly are desirably handled at the part level. Thus, in an embodiment of the present invention flat assembly 1220 is a list of parts not including subassembly information from a CAD tool. In an alternative embodiment, this step creates a flat assembly which considers and includes top level subassemblies that are not divisible and may be treated as a unit during disassembly. In a further embodiment, both approaches may be used and the user determines the selection of either one.

At step 1210, mating interfaces are generated. Generally in this step, each part of a given assembly is a triangulated polygonal representation and each triangulated polygonal representation of the individual parts is used to generate triangulated surfaces representing mating interfaces between pairs of parts. To be computationally efficient this process computes distances between parts and proceeds with mating interface computations only if the distance is less than specified threshold.

In an example, parts A and B represent individual parts of a given assembly. The mating interface between two parts A and B is a subset of triangles in one part (e.g. part A) that satisfy several threshold criteria. Since parts may not fit exactly to each other, generally the mating interface between parts A and B is not the same as the mating interface between parts B and A. Desirably, both mating interfaces are computed. The following criteria are the threshold criteria desirably employed by compute a mating interface:

1. The planes of the triangles are close to parallel.
2. Distances between triangles are less than a specified threshold.
3. Projection of triangle in part A on the plane of the triangle in part B overlaps the triangle in part B.

In an embodiment, mating interface computation 1210 evaluates the normal vectors to the triangles in both parts A and B and determines if there is an interface between the parts. To determine if there is an interface, the three threshold conditions above are evaluated for a given pair of triangles, for example one triangle from part A and another from part B. If all of the three threshold conditions are satisfied, then the triangle from model B is added to a mating interface. If not all of the threshold conditions are satisfied, then processing continues for another triangle pair. Processing continues in a double-loop fashion until all triangles from a first part are similarly processed with all triangles from a second part and added to the mating interface if the three threshold conditions are satisfied for a given pair. The mating interface represents the interface surface comprised of the triangles meeting the threshold conditions.

At process step 1220 of FIG. 2, local and global non-directional blocking graphs (NDBG) are generated. In this process step, mating interfaces generated above are further evaluated to determine movement constraints and interferences. Once the mating surfaces (polygons) are identified, normal vectors are applied to each in the mating surfaces' mesh. For each pair of components in the assembly that have non-empty mating interfaces, the interface normals are used to find the set of all feasible directions for moving one component from another without mutual collision. As used herein, a non-empty interface is a mating interface containing at least one polygon. Instead of considering the continuous space of all possible directions for explosion, the space of possible directions is desirably limited to a finite set of uniformly distributed directions. This finite set can be modeled by a finite set of points on a unit sphere; thus each point in the set corresponds to a normal vector. Using a discretized sphere and normal vectors-to-points on the sphere, and using the Boolean intersection of possible directions corresponding to each polygon in the mating surface, the possible directions of part movement without mutual collision are determined. As used herein, a discretized sphere is defined as a finite set of points uniformly spread on a unit sphere. The possible directions corresponding to one polygon represent a set of points on the discretized sphere that belong to a hemisphere opposite to polygon's normal vector. The possible directions corresponding to a set of polygons represent a Boolean intersections of sets of possible directions corresponding to each polygon in the set.

Alternatively, a complementary approach to finding possible direction is the analysis of arrangements of polygons on a sphere. This approach is known to be more complex in implementation. The result of this analysis is a set of directions for possible explosion of the parts of the assembly.

A pair of parts, for example A and B, are in a blocking relation (constraint) relative to a specified direction, if the straight line motion of part A in this direction will cause collision of part A with part B. The notation for this would be d: (A,B). Here d stands for direction, and (A, B) denotes a constraining relation. If the collision occurs within a small finite distance, it is considered a local constraint, otherwise, it is a global constraint. Given a set of parts representing an assembly, a directional blocking graph DBG for a specified direction is a list of all blocking constraints among these parts relative to this direction. A union of DBGs for a set of multiple directions is called a non-directional blocking graph, or NDBG. Non-directional blocking graphs (NDBG's) are algebraic representations of geometric constraints.

Figure 4:
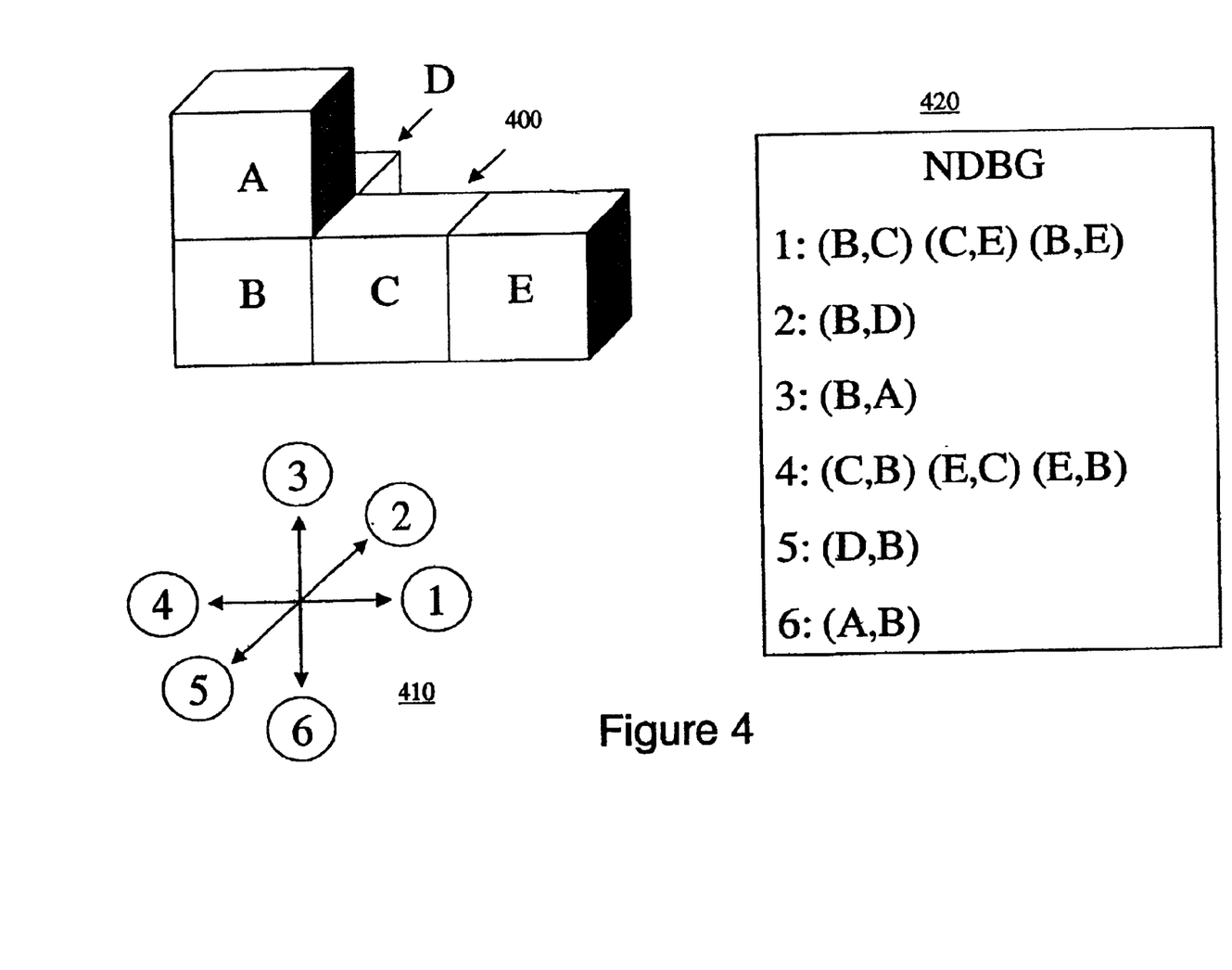
FIG. 4 is an illustration of an exemplary non-directional blocking graph (NDBG) useful in embodiments of the method illustrated in FIG. 2; and, FIG. 5 is an illustration of exemplary removal sequence useful in embodiments of the method illustrated in FIG. 2.

Referring to FIG. 4, there is shown a representative NDBG. An assembly 400 is shown with parts or components A, B, C, D and E. Directions 410 are shown as 1, 2, 3, 4, 5 and 6. A DBG and a NDBG can be local or global depending on what constraints are included (local or global). A unit sphere can represent all straight-line motions in 3D space. Each point on a sphere is a vector along a specified motion direction. A Non-directional Blocking Graph (NDNG) is a subdivision of this sphere into regions such that for all directions in one region Directional Blocking Graphs are identical. For example, referring to FIG. 4, components B and C, C and E, and B and E are listed as component pairs in direction 1. Thus, components B and C are in a product assembly such that B blocks C in a given direction, therefore the pair (B, C) is inserted in that directional blocking graph. Similarly, the pairs (C, E) and (B, E) are added for direction 1. Here (B, E) is a global constraint. Multiple directional blocking graphs are similarly defined for other given directions. The non-directional blocking graphs are computed by first representing the space of all directions in 3D, the unit sphere in 3D, as a discretized sphere. The discretized sphere is a finite set of points uniformly distributed on the sphere. Each DBG is computed and stored for each point of the discretized sphere. The number of directions and the directions are defined by the discretized sphere. A non-directional blocking graph is obtained by merging all directional-blocking graphs for all directions represented by discrete set of points on a sphere.

In a further embodiment, part connectivity information (parts are connected if there is a non-empty mating interface between them) is also stored as a result of the mating interface and NDBG generation steps. Connectivity, as used herein, refers to the condition of parts having a physical connection. It is to be appreciated that connectivity information is useful for various aspects of part and assembly model manipulations. Given a group of parts of an assembly, the connectivity information can be used to define connected components in the group of parts.

The number of possible assembly sequences consistent with the non-directional blocking graph generated grows exponentially in the worst case as a function of the number of components. As stated above, in practice, a subset of the possible assembly sequences are implemented. Therefore, it is desirable to capture in programmatic rules additional constraints that will reduce the number of possible sequences. Analysis and classification of industrial assemblies are performed to generate heuristics for the assembly sequence selection. Generally, the first candidates for analysis are symmetry constraints. Symmetries are automatically extracted from CAD models. Alternatively, another way to reduce the number of possible assembly sequences is visual analysis of the assembly such that the user selects part groups. These groups may be considered as user specified symmetries. This approach does not require specification of assembly hierarchy by the user, but if one is provided, it can be validated and used for service sequences and exploded views. If validation fails, the closest valid assembly sequence will be found. A further alternative for reducing the number of possible sequences is using connectivity information.

Figure 5:
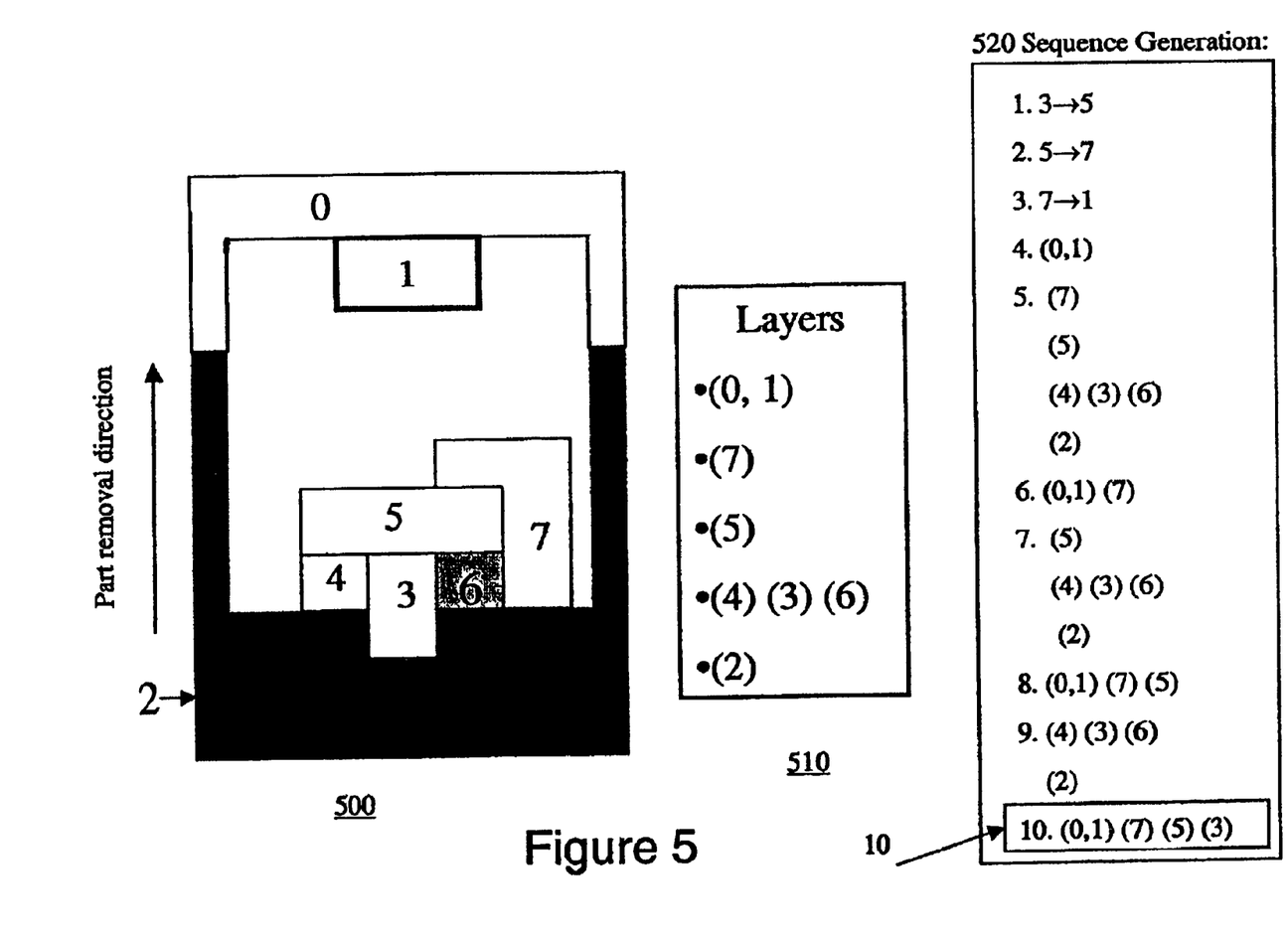

Referring further to FIG. 2 at step 1230, layers are generated. As used herein, layers refer to a grouping of parts. For the purposes of the present invention, layers are numbered 1, 2, . . ., and more specifically refer to groupings of parts that can be removed from the assembly without colliding with other parts in the same and all following layers. For example, parts in layer 1 can be removed from the assembly without colliding with other parts. Parts in layer 2 can be removed without colliding with parts in layer 2 and parts in layers 3, 4, . . ., etc. Additionally, layers provide a removal order for some parts or alternatively groups of parts. Referring to FIG. 5, there is shown an example of layers in two dimensions (2D). Assembly 500, is made of parts 0 through 7. Layers are generated to create a sequence (shown as 10 in sequence generation 520 of FIG. 5) for part removal in a given direction, based on information such as mating interfaces and the NDBG. For the example in FIG. 5, the part removal direction is upward and multiple layers 510 are shown. The part pair (0, 1), for example, is the first layer in the upward direction. Part 7 is next, since it must be removed to allow the next layers to be removed. Part 5 is the next layer. Thereafter, the layer containing parts 4, 3 and 6 specifies that either of the parts may be removed in no particular order. Finally, part 2 represents the last layer in the given direction. It is to be appreciated that the teachings provided by the 2D example are equally applicable to higher dimensions and multiple removal directions. In an embodiment, the first possible removal sequence (part or group and direction) is selected. In a further embodiment, the layer generation step may evaluate all possible removal sequences and select an optimal sequence. In order to generate layers in step 1230, the following conditions are desirably employed:

1. Every part belonging to a given layer is removable from the assembly of parts, excluding parts in all previous layers.

2. If at some point during generating layers, any single part cannot be removed without collision with the parts left, then it is attempted to remove groups of parts until at least one group can be removed;

3. If the second condition fails or there are no parts left in the assembly, processing stops;

4. The remaining parts comprise one connected component, therefore, if after removing a part, the remaining parts are split in several connected components, all but one of connected components are added to the removed part while still satisfying condition 2 for the group of removed parts.

When parts are removed from the assembly, a data structure is created that specifies the part number (or the part numbers, if removing a group of parts) and the direction of removal for this part (or group of parts) that is consistent with the information contained in NDBG.

The previous process steps that have been described are generally applicable to straight-line removal paths. In the course of maintenance and repair, often removal paths are not straight-line translations. In an embodiment of the present invention, at step 1240, linearly non-separable groups of parts are computed based on the created flat assembly and the generated layers in order to determine groups of parts that cannot be separated by straight-line translations. As a result of applying this process step to an input assembly, groups of parts are identified that contain a list of linearly non-separable groups of parts.

At step 1250, non-linear paths for disassembling groups generated in 1240 (linearly non-separable groups) are computed using any of various known path-planning techniques.

At step 1260, disassembly sequences for each part in the assembly are generated and stored. For the convenience of describing step 1260, it is assumed that there are no linearly non-separable groups of parts. If such groups exist, it is to be appreciated that the step can be modified based on the existence of computed and stored non-linear path removal sequences generated by step 1250.

The generation of disassembly sequences is desirably a recursive process wherein each part, group of parts, generated layers, removal paths, and the NDBG are evaluated to determine a complete disassembly sequence. As a result of this process step, a disassembly sequence is represented as a sequence or list of removal steps. Removal steps may include a single part or a group of parts. The disassembly sequence also desirably specifies a disassembly order.

Finally at step 1270, an exploded view of the disassembly sequence is generated for the purposes of use in maintenance and service of the field equipment. The disassembly sequence generated above at step 1260 is the input data for this process step. An exploded view is a representation of the disassembly including computed displacement distances along a part removal direction for each part in the disassembly sequence. Desirably, during the exploded view generation displacement distances are computed such none of the parts or groups of parts in the disassembly sequence collides with other parts. An exploded view displays the disassembly with all parts in the sequence placed according to the computed distances. In a first embodiment, the exploded view is desirably displayed to field service personnel and their personal service equipment. In this embodiment, service personnel are able to change the position, orientation, and view angle to create images that convey the assembly structure. In further embodiments, if desired, the images resulting from the exploded view generation are printed copies for incorporation into service manuals.

The sequence of actions generated as described above is desirably output in a form acceptable to the automated task order generator 130, and thereafter converted by automated task order generator 130 into understandable assembly/maintenance instructions. Simple actions will be defined for each part, such as position, move, turn, etc. along with the part identity, distance, and direction of motion for the explosion. Generally the order of removal/assembly is relevant for maintenance tasks. Therefore, the order in which these actions are input to the automated task order generator are assumed to be the order in which they will be performed by a maintenance technician.

Automated task order generator 130 is adapted to produce a set of clear and concise instructions in natural language, written or spoken, that could be followed step-by-step by a service technician to perform a specific maintenance task. A maintenance task usually involves removing certain parts from an assembly in order to replace them or to reach other parts.

Natural language generation is a sub-field of computational linguistics and artificial intelligence research devoted to studying and simulating the production of written or spoken discourse. The study of human language generation is a multidisciplinary enterprise, requiring expertise in areas of linguistics, psychology, engineering, and computer science. Generally, natural language generation technology is the study of how computer programs can be made to produce high-quality natural language text from computer-internal representations of information. Natural language generation is often characterized as a process that begins from the communicative goals of the writer or speaker, and involves planning to progressively convert them into written or spoken words. In this view, the general aims of the language producer are refined into goals that are increasingly linguistic in nature, culminating in low-level goals to produce particular words. Usually, a modularization of the generation process is assumed, which roughly distinguishes between a strategic part (deciding what to say) and a tactical part (deciding how to say it). This strategy-tactics distinction is partly mirrored by a distinction between text planning and sentence generation. Text planning is concerned with working out the large-scale structure of the text to be produced, and may also comprise content selection. The result of this sub-process is a tree-like discourse structure that has at each leaf an instruction for producing a single sentence. These instructions are then passed to a sentence generator, whose task can be further subdivided into sentence planning (i.e. organizing the content of each sentence), and surface realization (i.e. converting sentence-sized chunks of representation into grammatically correct sentences). The different types of generation techniques can be classified into four main categories: 1) canned text systems; 2)template systems; 3)phrase-based systems; and, 4)feature-based systems.

Canned text systems constitute the simplest approach for single-sentence and multi-sentence text generation. Template systems rely on the application of pre-defined templates or schemas, and are able to support flexible alterations. The template approach is used mainly for multi-sentence generation, particularly in applications whose texts are fairly regular in structure. Phrase-based systems employ generalized templates. In such systems, a phrasal pattern is first selected to match the input, and then each part of the pattern is recursively expanded into a more specific phrasal pattern that matches some sub-portion of the input. At the sentence level, the phrases resemble phrase structure grammar rules; and at the discourse level they play the role of text plans. Feature-based systems represent each possible minimal alternative of expression by a single feature. Accordingly, each sentence is specified by a unique set of features. In this framework, generation consists of the incremental collection of features appropriate for each portion of the input.

An embodiment of automated task order generator 130 includes a hybrid approach combining several of the above techniques. Task order instructions follow a fairly regular structure that makes the tactical generation part relatively more constrained than would be the case with a more open-ended applications, e.g., news reporting. Task order instructions are multi-sentence and multi-paragraph texts that require discourse level generation capabilities to address text coherence and readability issues. The strategic generation part (what to say) is partially given by the service sequences representation. However it does not address the issue of granularity of the final instructions, which has to be decided before tactical generation begins. Clearly, different levels of detail may be acceptable, even desirable, depending upon the nature of maintenance task and the expected-level of expertise of the service personnel.

As described above, the exploded view representation defines possible removal paths for various parts and sub-components of an assembly. These paths are described in terms of geometric functions that track three-dimensional coordinates of each point of the moving parts. These paths need to be mapped onto sequences of elementary motions that can be described using natural language expressions from existing and emerging systems of semantics in order to design a representation language suitable for describing motions and relationships of parts in an exploded view. For example, a straight-line motion of a part can be expressed as a primitive action MOVE:MOVE (P1, D1, DIR) where P1 stands for the part, D1 specifies the distance, and DIR gives direction with respect to some global coordinates (e.g., 30° NE). Similarly, a circular motion can be described using a primitive action TURN:TURN (P1, DIR, DEG) where DEG is the degree (positive or negative). Other such actions will be defined as required. It is to be noted that the primitive actions must be such that a human operator can perform them. For example, if a part is to be removed using a motion along a curve, this operation is desirably described giving straight-line direction from a start point to an end point, possibly with additional qualifications to follow the shape of an available passage. In addition, basic states of moving parts with respect to some global coordinates are desirably provided, as well as with respect to other parts. For example, POSITION(P1, X, Y, Z) may describe absolute three-dimensional coordinates of part P1. Such position description will be generated whenever a change of motion occurs. For example, when a circular motion changes into a straight-line motion, a state primitive (i.e., not derived but the primary basis of the position description) is inserted to capture the position of the part at that moment. The state primitive will serve later to define boundary conditions for both the preceding and the following motion predicates, so that a human-readable instruction can be obtained, e.g., turn the knob counter clockwise until it can be removed. States describing parts relationships to other parts and to the rest of the assembly are captured as well. For example, a meta-operator (i.e., an operator that is more comprehensive or transcending): ENABLED(A1) where A1 denotes a primitive action, such as MOVE or TURN, simply says that action A1 can be performed as described. Similarly, DISABLED (A1) indicates that action A1 can no longer be continued, perhaps as a result of a moving part encountering an obstacle on its way. This information can be obtained from the blocking graph, which is part of the exploded view representation. Other states will be defines as needed. It is to be appreciated that even this minimal set of primitives can be used to express a variety of instructions. For example, the instruction "turn the knob clockwise until you feel resistance" is described as follows: if A1=TURN(K1, CL, X>0) & ENABLED (A1) then TURN (N1, CL, X) until DISABLED(A1). Language of primitives has been a popular method for expressing meaning of natural language statements.

Automated task order generator 130 translates the exploded view representation of part removal from an assembly from service sequence generator 120 into natural language instructions that a human technician can understand and follow in order to verify their validity. This translation process proceeds in two automated steps: 1) translating the exploded views geometric representation into a sequence of primitive actions and states, and 2) synthesizing human—readable instructions from the primitive language sequence. In general, the translation process consists of the following steps:

a. Segmenting the removal paths—The removal paths for parts in the exploded views are divided into segments, such that each segment can be described by a single primitive action followed by a description of a basic state.

b. Supplying action parameters—Motion coordinates for each segment are converted into primitive action parameters, e.g., from here to there.

c. Supply human position and actions—The position and actions of the human operator are inserted into the sequence. Before an action can be performed, a technician may have to position himself or herself properly with respect to an assembly. This is also important for generating coherent and understandable natural language instructions, e.g., move to the right.

Automated task order generator 130 converts sequences of primitive actions into human-readable instructions. These instructions must be clear and concise so that a technician performing verification can understand and execute them. The conversion process involves translating sub-sequences of primitive actions into natural language commands and other supporting expressions. Normally, predicates such as MOVE or TURN, along with directional parameters will be translated into verbs and verb groups, e.g., pull or push down firmly. Parameters denoting objects will be translated into noun phrases, e.g., red bolt. Primitive action predicates of single primitive actions or sequences of primitive actions are desirably translated into verb groups. These verb groups denote specific actions to be performed by the human technician on an assembly, e.g., pull to the right. Primitive action parameters are desirably converted into noun phrases that uniquely identify objects and parts to a human technician, e.g., the square-headed bolt. Certain sequences of primitive actions that apply to the same object may be reduced to meta-actions that are commonly understood by human readers. For example, TURN (BB1, CCL, z) until ENABLE (MOVE(BB1, d1, d2)) may produce a natural language instruction of unscrew the blue bolt, rather than a more direct turn the blue bolt counterclockwise until it can be removed. Whenever necessary, supporting instructions for the human technician are supplied. These include positioning instructions (e.g., face the assembly so that the red handle is to your left), as well as performance instructions (e.g., firmly grasp the red handle). These instructions are desirably derived from the assembly orientation coordinates supplied with the service sequences from service sequence generator 120, as well as from the data available about parts (weight, size, etc.). These supporting instructions serve as linguistic devices to help the human technicians orient themselves as they perform the validation process.

Desirably, in order to increase readability of a task order sequence, discourse level cohesiveness devices are included in the instructions. For example, if adjacent commands are relating to the same part, it will enhance the overall readability of the instructions if an anaphoric reference is used instead of repeating the full part description. For example, "Turn the small red handle clockwise until resistance is encountered, then pull it firmly to remove" is clearly preferred to "Turn the small red handle clockwise until resistance is encountered. Pull the small red handle firmly. Remove the small red handle."

Both the sequence of events generated by service sequence generator 120 and instructions generated by task order generator 130 are validated to ensure that the instructions can be carried out by a human operator. Desirably validation is performed after service sequence generation by service sequence generator 120 and after task order generation by task order generator 130. In a first aspect, the generated sequence is validated. The purpose of this validation is to establish that a human will be capable of performing a given service event, given that his arm and tools will be in the equipment as well. Human factors needing verification include ability to reach and grasp parts (using hands or tools), ability to perform certain motions (such as turning and pulling), as well as other factors that may limit a person's ability to carry out required sub-tasks, e.g., weight, length, or visibility of components. In an embodiment of system 100, validation unit 140 validates the sequence generated by service sequence generator 120 and provides any needed feedback to service sequence generator 120 such that service sequence generator 120 produces a feasible sequence. In a second aspect, the generated natural language task instructions are validated. A primary purpose of this validation is to establish that the instructions are clear enough to allow the human to understand which parts need to be removed and in what order and with what tools. Additionally, this validation may further validate human factor considerations described above. Conditions are supplied to validation unit 140 that are verifiable within the range of normal human sensory abilities. For example, while it may be acceptable to turn the knob approximately 30° clockwise, it is not reasonable to specify an exact number, e.g., 37°. If exact distance values are critical to perform a procedure successfully, alternative end conditions are desirably supplied, e.g., turn the knob until the notch aligns with the blue line. When the information is available in the exploded view sequence or in the primitive action sequence, an approximate or alternative wording is used to convey the desired meaning. When no such information exists, the task order instructions may be modified or enhanced for insertion of non-geometric information or additional features for reference in the task order instructions, e.g., painting a blue line on the part's surface and referencing the blue surface with the modified instructions.

Instructions generated from automated task order generator 130 are verified by validation unit 140. In an embodiment of the present invention, validation unit 140 is adapted to verify that the resulting natural language instructions generated by task order generator 130 can be carried out by a human technician. The methods and techniques described in the preceding sections create virtual removal paths for all serviceable parts of an assembly, but it does not guarantee that such removals can be physically performed or understood by a human. In order to support human verification, the service sequences and removal paths are converted into clear, concise natural language instructions for the human technician. The technician verifying a procedure will perform the steps as specified in the instructions. If the procedure can be carried out successfully, the verification is achieved. Otherwise, the cause of failure is identified and fed back into the system. If the failure occurs from vague, inconsistent, incomprehensible, or impossible to carry out instructions, the generation process is then repeated until a verifiable procedure is created. The language generation process ultimately produces English instructions, for example, but it could be adapted to other languages by substituting appropriate lexical realization components. Furthermore, the generation process is extendible to multimedia presentations, e.g., three-dimensional animation with a voice-over.

Written instructions, with graphics and context information, are used by human technicians to verify a task order sequence in a virtual environment and typically require the technician to constantly move their eyes between the text and the assembly. This may be disadvantageous under certain conditions, for example, when operating in narrow spaces. In another embodiment of the present invention, validation unit 140 is adapted to convert the written instructions into spoken commands that can be read to the operator one step at a time. This conversion is desirably accomplished using text-to-speech (TTS) technology, augmented with a speech recognition system (SRS) that understands simple commands such as repeat, done, next, go back, etc. Exemplary systems include TTS systems from Lernout & Hauspie, Lucent and Elan, as well as limited vocabulary SRS products from Lernout & Hauspie, IBM, Nuance, Phillips and others.

In a further embodiment of the present invention, validation unit 140 is adapted to utilize 6 degree of freedom haptics force-feedback technology to enable engineers to assess designs in a virtual environment. The haptics technology allows designers to virtually "grab" parts in an assembly and attempt to remove the part to determine if the maintenance action is feasible. Haptics is the field of tactile feedback in which a resistance force is applied in response to and against a user-initiated movement, which thereby imparts a sensation of touch to the user. By programming a computer with the space, surface, and location parameters of a predetermined space and/or object, a user of a haptic interface can simulate or model a sensation of "feeling" a particular object or manipulating the object in space without actually touching the surface or the object itself.

Figure 3:
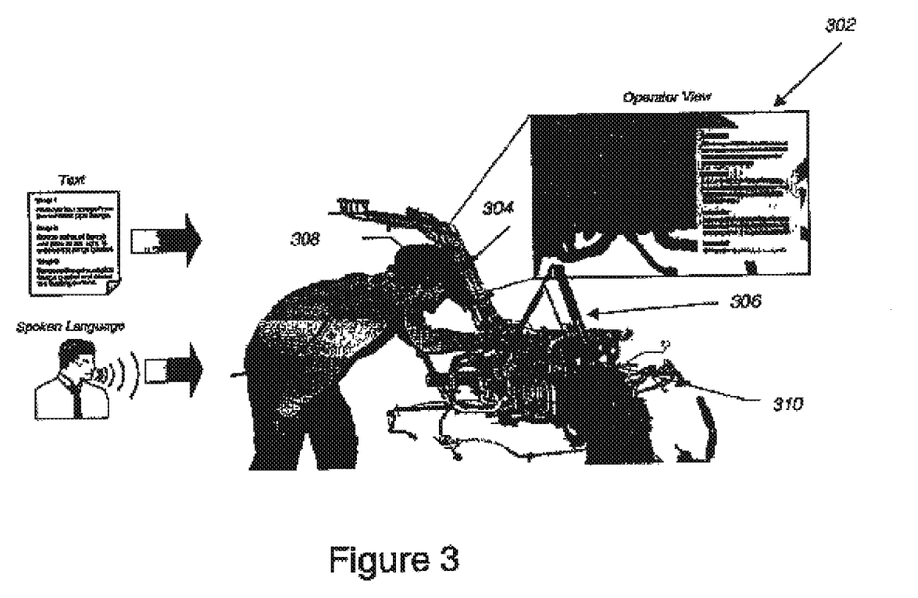
FIG. 3 is a block diagram illustrating a method for haptics enabled verification and validation of instructions useful in embodiments of the system illustrated in FIG. 1.

The haptic interface actually includes a broader range of equipment than is typically associated with a computer interface. FIG. 3 shows a typical haptic interface system that includes a computer or processor with memory (not shown) for storing space, location, and resistance data associated with a given object(s) or space. Connected to the computer is a display screen 302 for viewing the manipulated object in virtual space. The user 308 grasps a haptic device 306, which is typically an articulated arm with sensors to detect three directions of movement and three axes of rotation, also known as six degrees of freedom. Therefore, when user 308 manipulates the object in virtual space by moving haptic device 306, the sensors detect the combined movement in the six degrees of freedom, communicate the movement to the computer, which in turn translates the haptic device movement into movement of the object as displayed on the screen 302. The virtual effect of the object movement can be viewed by user 308 on the display screen 302 or, alternatively, through a user headset with goggles 304. As the object is moved in virtual space towards another object by operation of the haptics device 306, the computer detects when the relative spaces occupied by the objects coincide, thus detecting a collision, and directs the motors in the haptic device 306 to resist further movement by user 308 in the direction of the collision, thereby providing tactile feedback to the user 308 that the objects are in virtual contact. A data glove 310 is also desirably included in a haptics interface for tracking hand position in the virtual environment.

In an embodiment, a visualization front end is employed that allows the user to define a "haptic" workspace comprised of static or non-moving parts, as well as the removable part (or assembly of parts). Once this workspace is identified, the data is preprocessed to generate the structures necessary to perform collision detection at the rate required by the haptic device. In employing other embodiments of the present invention, a person doing the virtual validation will be substantially automatically enabled without having to define such a haptic workspace. Thus, the person doing the virtual validation will indicate the next part to be removed, for example by pointing at it in virtual space (using the data glove), wait for the computer to prepare the haptic experience for that part, then reach out again, grabbing the haptic device/virtual part and removing it. For the forces to be realistic in the haptic environment, they require an update rate of about 1 thousand times per second. Therefore, collision detection (including collision locations) must be performed at a significantly faster rate, making known typical polygonal collision detection techniques inadequate. A method for accomplishing the required collision detection rates is described as follows. The three-dimensional CAD models are pre-processed to generate a volume to represent the nonmoving, static parts and a set of points to represent the moving part (or assembly) in the haptic environment. The basic method for collision detection is to transform the moving part (points) into the static parts (volume). The collision detection rate requirement is met by transforming only the points that may be in collision into the volume, based on knowledge gained from previous collision tests and constraints imposed on how fast the moving parts can be moved.

In a further embodiment of the present invention, validation unit 140 is further adapted to provide the ability to have an interactive session in which multiple parts are extracted from an assembly. Known haptics systems are limited in that one part (or assembly) removal per haptic workspace is permitted. In this embodiment of the invention, a maintenance technician is able to seamlessly follow maintenance instructions from the natural language engine. With known haptics systems, the conversion of CAD geometry into multiple part/assembly removal workspaces is computationally intensive, requiring modification every time a part is added or removed. For example, if parts A, B, C, and D comprise a component, and A is to be removed; then B, C, and D make up the static environment represented by the volume. Once part A is removed, and if the instructions state part C should be removed, then part C becomes the "moving" part and the static environment is comprised of parts B and D. The known systems generally require loading of another workspace or re-computation of the region affected by part A, both requiring time and limiting the ability of the maintenance technician to remove parts in an order other than specified by the instructions. This situation becomes magnified when tools are continually inserted and removed from the environment, because they switch back and forth from being part of the moving part and fixed environment. In this embodiment, the technician is desirably permitted to remove parts in a random order. Further, the technician will have the ability to identify better ways to do the tasks, as well as identify instructions that are difficult to understand (by accidentally doing things in the wrong order).

To allow multiple part removal, one option is to build a database of the static volumes for each piece part in the virtual product assembly. For a given procedure, the static volume could be built much more quickly than is currently done by simply comparing the samples from the individual volumes. However, this alone would be insufficient to allow the user to remove a part with little or no notice, because a static volume could be comprised of billions of samples. This plan would use a higher order volume of "bricks" that correspond to blocks of N×N×N samples of the main volume (where N>1). Each brick would contain a table indicating which parts affect the samples within the brick, allowing the user to quickly determine the effect of a part being removed. In the example above, part C was originally represented in the fixed volume, but after removing part A it becomes the moving part. Instead of re-computing the entire volume, the higher order "brick" volume is queried to determine which of the samples need to be re-computed by comparing the individual volumes of parts B and D.

In the context of haptics, the term fidelity is the extent to which the haptic collision detection approximates a brute-force polygon-by-polygon intersection test. Ultimately, the fidelity of the collision detection needs to be as high as possible. High fidelity permits forces transferred through the haptic device to be as accurate as possible for the environment, and also ensures that no erroneous conclusions are drawn about the ability of a part to move collision-free along a particular path. Generally, there is no need to do collision detections more often than 1000 times per second, though doing each point test faster allows the ability to test more points, resulting in higher fidelity. Increased fidelity reduces discontinuities in the forces felt on the haptic device.

In a further embodiment, the technician is immersed in a virtual environment. FIG. 3 shows an embodiment of a haptics interface including head-mounted display capable of tracking head movement while viewing a three-dimensional scene, allowing the scene to move naturally. High graphic rendering speed is generally required to avoid motion sickness by the user (also, minimal tracking lag time and high sampling rate of the tracking device are generally required). Head movement tracking is employed as a means to change the display environment. Desirably, validation unit 140 is adapted to limit the amount of unnecessary graphics updates to avoid scene re-renders with every insignificant head movement, similar to the anti-shake feature in a video camcorder. To track the users hand and arm movement in the virtual environment, data glove technology (Virtual Technologies data glove, for example) and body tracking technology (Ascension Technologies flock of birds, for example) are desirably included in validation unit 140. These technologies enable users to see their hands and arms in the virtual environment as the maintenance task is being performed. Finally, the haptics environment is continuously monitored and the static position of the haptics device end effector (the "end effector" is the part of the haptic device that the user grasps, usually an ordinary handle, but could conceivably be a mock-up of a moving part in the virtual environment) is updated as it simulates the part to be removed. Since these maintenance scenarios require multiple parts to be removed in an undefined order, the location of the hand as it reaches out to grasp the part and position the haptics device end effector are tracked appropriately. To accomplish realism from a visual perspective, the tracking of hand motion (finger joints, etc.) will end when the virtual hand has come in contact with the object in the virtual environment. Otherwise, the user's virtual hand would penetrate the object in the environment. Alternatively, other available technologies such as a CyberGrasp type device may be employed. This type of device permits forces to be individually applied to each finger, thus fingers could be stopped instead of allowing the hand to continue to close.

Referring further to FIG. 1, computing environment or system 100 further includes instruction delivery unit 150. Embodiments for delivery unit 150 include voice instructions, written instructions (e.g. service manual), animated video instructions as well as web-based virtual training instructions. The instructions are acquired from the processes described above with reference to service sequence generator 120, automated task order generator 130 and validation unit 140. Delivery unit 150 is adapted to convey the instructions, in the desired format (written, voice, web-based virtual, or video) for enabling field service maintenance personnel to perform the desired maintenance task or tasks. Alternatively, delivery unit 150 conveys training information. The format of the instructions for a particular task is selectable by the technician. For example, the technician may select voice instructions or written instructions for a given task. System 100 is further adapted to permit technician feedback to engineering data generator 110. As maintenance tasks are performed, the technician is permitted to convey feedback in the form of alternative or updated task sequences via delivery unit 150 to engineering data generator 110. Feedback from field service personnel is incorporated into engineering data, thus benefiting future engineering design activities and technical documentation generation. Technician feedback is desirably included in engineering data that is used to generate technical documentation or other task order media for future products that are technically close to the new product (often known as a "make from").

From the present description, it will be appreciated by those skilled in the art that the methods and systems are universally applicable, regardless of language of the engineering data.

The flow diagrams depicted herein are examples only. There may be many variations to these diagrams or steps (or operations) described therein without departing from the spirit of the invention. For instance, the steps may be performed in a differing order, or steps may be added, deleted or modified. All of these variations are considered a part of the claimed invention.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A computer implemented method for enabling at least one of field service of machines and training of field service personnel comprising:

generating at least one validated sequence of actions for at least one maintenance task;

validating said at least one sequence in a virtual environment to ensure said sequence can be performed by field service personnel;

converting said at least one validated sequence into instructions for said at least one maintenance task; and, delivering instructions for said at least one validated sequence for use in performing said at least one maintenance task.

2. The method of claim 1 wherein said instructions comprise natural language instructions.

3. The method of claim 2 wherein said natural language instructions comprises at least one of written instructions, voice instructions and animated exploded view video instructions.

4. The method of claim 1 wherein the generating step imports engineering data comprising a Computer Aided Design (CAD) model.

5. The method of claim 1 wherein the generating step comprises:

importing said engineering data;

determining mating interfaces of a plurality of component parts within a given assembly;

creating at least one component part removal path for at least one of said component parts; and, generating said at least one sequence of instructions responsive to said creating step.

6. The method of claim 5 further comprising repeating said generating step to generate a plurality of sequences.

7. The method of claim 1 wherein said validating step is performed with a haptic interface.

8. A computer implemented method for enabling at least one of field service of machines and training of field service personnel comprising:

generating at least one sequence of actions for at least one maintenance task;

validating said at least one sequence in a virtual environment to ensure said sequence can be performed by said field service personnel;

converting said at least one validated sequence into instructions for said at least one maintenance task; and, delivering instructions for said at least one sequence for use in performing said at least one maintenance task.

9. The method of claim 8 wherein the validating step provides feedback to the generating step, said feedback relating to human factors needed to perform said at least one maintenance task and said human factors including at least one of reach and grasp of parts, ability to perform certain motions, and factors relating to weight, length and visibility of components.

10. The method of claim 8 wherein the delivering step comprises providing written instructions.

11. The method of claim 8 wherein the delivering step comprises providing alternate instruction presentation such as voice instructions.

12. The method of claim 8 wherein the delivery step comprises providing animated exploded view video instructions.

13. The method of claim 8 wherein the generating step imports engineering data comprising a Computer Aided Design (CAD) model.

14. The method of claim 8 wherein said validating step is performed in a virtual environment.

15. The method of claim 8 wherein said validating step is performed with a haptics interface.

16. The method of claim 8 wherein the generating step comprises:

importing engineering data from a Computer Aided Design (CAD) model;

determining mating interfaces of a plurality of component parts within said CAD model;

creating at least one component part removal path for at least one of said component parts in a given exploded view; and, generating said at least one sequence of instructions responsive to said creating step.

17. The method of claim 16 further comprising repeating said generating step to generate a plurality of sequences.

18. A system for enabling at least one of field service of machines and training of field service personnel comprising:

an engineering data generating device for computing and providing engineering data relating to said machines;

a service sequence generator for importing and processing said engineering data to generate at least one sequence of instructions for at least one maintenance task;

an automated generating device for converting said at least one sequence of instructions into natural language instructions for use in said at least one maintenance task;

a validating device for verifying said at least one sequence and natural language instructions in a virtual environment to ensure said sequence could be performed by said field service personnel; and, a delivery device for delivering said natural language instructions to said field service personnel.

19. The system of claim 18 wherein said engineering data generating device is a Computer Aided Design (CAD) system and said engineering data comprises at least one of CAD models and engineering drawings.

20. The system of claim 18 wherein said automated generating device produces human-readable instructions for said maintenance tasks.

21. The system of claim 18 wherein said human-readable instructions comprise at least one of written instructions, voice instructions and animated exploded view video instructions.

22. The system of claim 18 wherein said validating device comprises a haptics device.

23. The system of claim 18 wherein said service sequence generator is further for generating a plurality of collision-free part removal paths for said at least one sequence of instructions.

24. The system of clam 18 wherein said delivery device is further for permitting said service personnel to select a desired format for said instructions.

25. The system of claim 24 wherein said format comprise at least one of written instructions, voice instructions and animated exploded view video instructions.

* * * * *